United States Patent
Boselli et al.

(10) Patent No.: US 10,446,537 B2
(45) Date of Patent: Oct. 15, 2019

(54) ELECTROSTATIC DISCHARGE DEVICES

(71) Applicant: TEXAS INSTRUMENTS INCORPORATED, Dallas, TX (US)

(72) Inventors: Gianluca Boselli, Plano, TX (US); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/835,396

(22) Filed: Dec. 7, 2017

(65) Prior Publication Data

US 2018/0366460 A1    Dec. 20, 2018

Related U.S. Application Data

(60) Provisional application No. 62/522,176, filed on Jun. 20, 2017.

(51) Int. Cl.
*H01L 27/02* (2006.01)
*H01L 23/60* (2006.01)
(Continued)

(52) U.S. Cl.
CPC .......... *H01L 27/0248* (2013.01); *H01L 23/60* (2013.01); *H01L 23/62* (2013.01); *H01L 27/0229* (2013.01); *H01L 27/0262* (2013.01); *H01L 27/067* (2013.01); *H01L 27/0682* (2013.01); *H01L 27/1022* (2013.01);
(Continued)

(58) Field of Classification Search
CPC ............. H01L 27/0255; H01L 27/2409; H01L 27/0682; H01L 27/0288; H01L 27/0292; H01L 27/0229; H01L 27/1022; H01L 27/067; H01L 27/0296; H01L 27/0248;
(Continued)

(56) References Cited

U.S. PATENT DOCUMENTS 5,856,214 A * 1/1999 Yu ..................... H01L 27/0255
                                                      148/DIG. 174
5,898,193 A * 4/1999 Ham ................... H01L 27/0255
                                                      257/173
(Continued)

OTHER PUBLICATIONS

Torres et al., "Modular, Portable, and Easily Simulated ESD Protection Networks for Advanced CMOS Technologies", in Proc. of EOS/ESD Symp. 2001.

(Continued)

*Primary Examiner* — Sophia T Nguyen
(74) *Attorney, Agent, or Firm* — Jacqueline J. Garner; Charles A. Brill; Frank D. Cimino

(57) ABSTRACT

In accordance with at least one embodiment, an ESD device comprises: a semiconductor; a pad; a ground rail; a p-well formed in the semiconductor; a first p-type region formed in the p-well and electrically coupled to the ground rail; a first n-type region formed in the p-well and electrically coupled to the pad; a second n-type region formed in the p-well and electrically coupled to the ground rail; an n-well formed in the semiconductor; a first n-type region formed in the n-well; a first p-type region formed in the n-well and electrically coupled to the pad; and a second p-type region formed in the n-well and electrically coupled to the first n-type region formed in the n-well.

19 Claims, 5 Drawing Sheets

(51) Int. Cl.
*H02H 9/04* (2006.01)
*H01L 27/24* (2006.01)
*H01L 29/06* (2006.01)
*H01L 27/06* (2006.01)
*H01L 27/102* (2006.01)
*H01L 23/62* (2006.01)

(52) U.S. Cl.
CPC ...... *H01L 27/2409* (2013.01); *H01L 29/0649* (2013.01); *H02H 9/043* (2013.01); *H02H 9/046* (2013.01); *H01L 27/0255* (2013.01); *H01L 27/0288* (2013.01); *H01L 27/0292* (2013.01); *H01L 27/0296* (2013.01)

(58) Field of Classification Search
CPC ......... H01L 23/60; H01L 23/62; H02H 9/046; H02H 9/043
See application file for complete search history.

(56) References Cited

U.S. PATENT DOCUMENTS

| | | | | |
|---|---|---|---|---|
| 5,898,205 | A * | 4/1999 | Lee | H01L 27/0251 257/355 |
| 6,184,557 | B1 * | 2/2001 | Poplevine | H01L 27/0255 257/357 |
| 6,603,177 | B2 * | 8/2003 | Tang | H01L 27/0255 257/355 |
| 6,765,771 | B2 * | 7/2004 | Ker | H01L 27/0262 257/E29.225 |
| 6,858,902 | B1 * | 2/2005 | Salling | H01L 27/027 257/355 |
| 6,919,603 | B2 * | 7/2005 | Brodsky | H01L 27/0248 257/361 |
| 6,919,604 | B2 * | 7/2005 | Lai | H01L 27/0262 257/355 |
| 7,042,028 | B1 * | 5/2006 | Huang | H01L 27/0262 257/173 |
| 7,285,828 | B2 * | 10/2007 | Salcedo | H01L 27/0262 257/355 |
| 7,728,349 | B2 * | 6/2010 | Boselli | H01L 27/0262 257/107 |
| 8,664,690 | B1 * | 3/2014 | Chen | H01L 27/0262 257/107 |
| 8,946,822 | B2 * | 2/2015 | Salcedo | H01L 27/0259 257/355 |
| 9,006,782 | B2 * | 4/2015 | Salcedo | H01L 29/78 257/146 |
| 9,123,540 | B2 * | 9/2015 | Salcedo | H01L 29/7436 |
| 9,318,481 | B1 * | 4/2016 | Wang | H01L 29/66121 |
| 9,368,486 | B2 * | 6/2016 | Wang | H01L 29/87 |
| 10,163,888 | B2 * | 12/2018 | Gallerano | H01L 27/0248 |
| 2002/0053704 | A1 * | 5/2002 | Avery | H01L 27/0255 257/361 |
| 2003/0218841 | A1 * | 11/2003 | Kodama | H01L 27/0251 361/56 |
| 2004/0201033 | A1 * | 10/2004 | Russ | H01L 27/0262 257/107 |
| 2004/0217425 | A1 * | 11/2004 | Brodsky | H01L 27/0248 257/360 |
| 2005/0151160 | A1 * | 7/2005 | Salcedo | H01L 27/0262 257/173 |
| 2006/0268477 | A1 * | 11/2006 | Camp | H01L 27/0262 361/56 |
| 2007/0090392 | A1 * | 4/2007 | Boselli | H01L 27/0262 257/107 |
| 2008/0088994 | A1 * | 4/2008 | Lai | H01L 27/0262 361/56 |
| 2009/0294855 | A1 * | 12/2009 | Lim | H01L 27/0259 257/355 |
| 2011/0163352 | A1 * | 7/2011 | Gee | H01L 23/60 257/173 |
| 2012/0043583 | A1 * | 2/2012 | Abou-Khalil | H01L 27/0262 257/157 |
| 2012/0257317 | A1 * | 10/2012 | Abou-Khalil | H01L 27/0262 361/56 |
| 2013/0163128 | A1 * | 6/2013 | Van Wijmeersch | H02H 9/046 361/56 |
| 2013/0286520 | A1 * | 10/2013 | Shan | H01L 23/60 361/57 |
| 2014/0027815 | A1 * | 1/2014 | Su | H01L 27/0262 257/146 |
| 2014/0049313 | A1 * | 2/2014 | Lai | H01L 29/7436 327/530 |
| 2014/0054696 | A1 * | 2/2014 | Lai | H01L 27/027 257/339 |
| 2014/0167169 | A1 * | 6/2014 | He | H01L 27/0255 257/355 |
| 2015/0097264 | A1 * | 4/2015 | Tsai | H01L 27/0255 257/506 |
| 2015/0187749 | A1 * | 7/2015 | Dai | H01L 29/7436 257/173 |
| 2015/0236011 | A1 * | 8/2015 | Wang | H01L 27/0262 257/173 |
| 2016/0035713 | A1 * | 2/2016 | Iwamoto | H01L 27/0207 257/506 |
| 2016/0336744 | A1 * | 11/2016 | Parthasarathy | H02H 9/046 |
| 2017/0069618 | A1 * | 3/2017 | Altolaguirre | H01L 27/0262 |
| 2017/0179110 | A1 * | 6/2017 | Lee | H01L 29/7436 |
| 2017/0287899 | A1 * | 10/2017 | Wang | G11C 7/1084 |
| 2018/0286851 | A1 * | 10/2018 | Huang | H01L 27/0248 |
| 2018/0366460 | A1 * | 12/2018 | Boselli | H01L 27/0292 |

OTHER PUBLICATIONS

Stockinger et al., "Boosted and Distributed Rail Clamp Networks for ESD Protection in Advanced CMOS Technologies ", in Proc. of EOS/ESD Symp. 2003.

Tan et al., "RC-Triggered PNP and NPN Simultaneously Switched Silicon Controlled Rectifier ESD Networks for Sub-0.18μM Technology", in Proc. of IRPS 2005.

* cited by examiner

ELECTROSTATIC DISCHARGE DEVICES

CROSS-REFERENCE TO RELATED APPLICATIONS

The present application claims priority to U.S. Provisional Patent Application No. 62/522,176, which was filed Jun. 20, 2017, is titled "Dual-Diode ESD Cell With Embedded Lateral SCR To Enable Distributed Power Supply ESD Network," and is hereby incorporated herein by reference in its entirety.

BACKGROUND

Electrostatic discharge (ESD) energy, due to voltage spikes or bounces on one or more pins (or balls or leads) of a packaged integrated circuit, may damage the integrated circuit. An ESD device (or ESD cell) helps protect sensitive integrated circuits from ESD energy by shorting the affected pin to ground and to the supply rail. It is desirable for an ESD device to be effective in dissipating ESD energy while consuming relatively little silicon area in an integrated circuit.

SUMMARY

In accordance with at least one embodiment of the invention, an ESD device comprises: a semiconductor; a pad; a ground rail; a p-well formed in the semiconductor; a first p-type region formed in the p-well and electrically coupled to the ground rail; a first n-type region formed in the p-well and electrically coupled to the pad; a second n-type region formed in the p-well and electrically coupled to the ground rail; an n-well formed in the semiconductor; a first n-type region formed in the n-well; a first p-type region formed in the n-well and electrically coupled to the pad; and a second p-type region formed in the n-well and electrically coupled to the first n-type region formed in the n-well.

In accordance with at least one embodiment of the invention, in the ESD, the ground rail is at ground potential.

In accordance with at least one embodiment of the invention, the ESD further comprises an integrated circuit package; and an I/O package pin, wherein the pad is electrically coupled to the I/O package pin.

In accordance with at least one embodiment of the invention, in the ESD, the first p-type region formed in the p-well is highly doped to form an ohmic contact with the p-well, and the first n-type region formed in the n-well is highly doped to form an ohmic contact with the n-well.

In accordance with at least one embodiment of the invention, the ESD further comprises a supply rail electrically coupled to the first n-type region formed in the n-well and to the second p-type region formed in the n-well.

In accordance with at least one embodiment of the invention, the ESD further comprises: an integrated circuit package; and an I/O package pin, wherein the pad is electrically coupled to the I/O package pin.

In accordance with at least one embodiment of the invention, the ESD further comprises a supply rail electrically coupled to the first n-type region formed in the n-well and to the second p-type region formed in the n-well.

In accordance with at least one embodiment of the invention, the ESD further comprises a second p-type region formed in the p-well.

In accordance with at least one embodiment of the invention, the ESD further comprises a triggering circuit electrically coupled to the first n-type region formed in the n-well and to the ground rail, and comprising an output port electrically coupled to the second p-type region formed in the p-well.

In accordance with at least one embodiment of the invention, the ESD further comprises: a supply rail electrically coupled to the first n-type region formed in the n-well; wherein the triggering circuit comprises an RC circuit comprising a resistor and a capacitor in series with the resistor, wherein the RC circuit is electrically coupled to the first n-type region formed in the n-well and to the ground rail.

In accordance with at least one embodiment of the invention, in the ESD, the triggering circuit further comprises a trigger buffer coupled to the RC circuit, the trigger buffer to source current at the output port of the triggering circuit in response to a voltage spike on the pad.

In accordance with at least one embodiment of the invention, the ESD further comprises: a second n-type region formed in the n-well; and a supply rail electrically coupled to the first n-type region formed in the n-well and to the second p-type region formed in the n-well.

In accordance with at least one embodiment of the invention, the ESD further comprises: a triggering circuit electrically coupled to the supply rail and to the ground rail, and comprising a first output port electrically coupled to the second p-type region in the p-well, and a second output port electrically coupled to the second n-type region in the n-well.

In accordance with at least one embodiment of the invention, in the ESD, the triggering circuit comprises an RC circuit comprising a resistor and a capacitor in series with the resistor, wherein the RC circuit is electrically coupled to the supply rail and to the ground rail.

In accordance with at least one embodiment of the invention, in the ESD, the triggering circuit further comprises a trigger buffer coupled to the RC circuit, the trigger buffer to source current at the first output port of the triggering circuit in response to a voltage spike on the pad, and to sink current at the second output port of the triggering circuit in response to a voltage spike on the pad.

In accordance with at least one embodiment of the invention, the ESD further comprises: a first isolation region between the first p-type region formed in the p-well and the first n-type region formed in the p-well; a second isolation region between the first n-type region formed in the p-well and the second p-type region formed in the p-well; a third isolation region between the second p-type region formed in the p-well and the second n-type region formed in the p-well; a fourth isolation region between the second n-type region formed in the p-well and the second p-type region formed in the n-well; a fifth isolation region between the second p-type region formed in the n-well and the second n-type region formed in the n-well; a sixth isolation region between second n-type region formed in the n-well and the first p-type region formed in the n-well; and a seventh isolation region between the first p-type region formed in the n-well and the first n-type region formed in the n-well.

In accordance with at least one embodiment of the invention, a process comprises: forming a ground rail on a semiconductor; forming a pad on the semiconductor; forming a p-well in the semiconductor; forming a first p-type region in the p-well; coupling the first p-type region formed in the p-well to the ground rail; forming a first n-type region in the p-well; coupling the first n-type region formed in the p-well to the pad; forming a second n-type region in the p-well; coupling the second n-type region formed in the p-well to the ground rail; forming an n-well in the semiconductor; forming a first n-type region in the n-well; forming a first p-type region in the n-well; coupling the first p-type region formed in the n-well to the pad; forming a second p-type region in the n-well; and coupling the second p-type region formed in the n-well to the first n-type region formed in the n-well.

In accordance with at least one embodiment of the invention, the process further comprises: forming a supply rail on the semiconductor; coupling the supply rail to the first n-type region formed in the n-well and to the second p-type region formed in the n-well; forming a second p-type region in the p-well; and forming a second n-type region in the n-well.

In accordance with at least one embodiment of the invention, an ESD comprises: a semiconductor; a ground rail; a supply rail; a pad; a first diode formed in the semiconductor coupling the pad to the supply rail; a second diode formed in the semiconductor coupling the pad to the ground rail; a silicon controlled rectifier formed in the semiconductor coupling the supply rail to the ground rail; and a triggering circuit coupling the supply rail and the ground rail to the silicon controlled rectifier.

BRIEF DESCRIPTION OF THE DRAWINGS

For a detailed description of various examples, reference will now be made to the accompanying drawings in which.

DETAILED DESCRIPTION

Many integrated circuits employ one or more ESD devices, where an ESD device includes a dual-diode arrangement to couple an I/O (Input-Output) pad to a supply rail or to ground, and an active field effect transistor for shorting the supply rail to ground when a voltage spike or bounce is detected on the I/O pad. In some applications, it is found that such ESD devices may not effectively dissipate ESD energy compared to the intrinsic limit of silicon, and may consume too much silicon area on the integrated circuit.

In accordance with the disclosed embodiments, a system comprises an ESD device to protect an integrated circuit from voltage spikes or bounces affecting an I/O pad. An ESD device includes one or more triggering circuits to trigger one or more silicon controlled rectifiers to short a supply rail to a ground rail. It is expected that such embodiments are effective in dissipating ESD energy while consuming a relatively small area of an integrated circuit.

Figure 1:
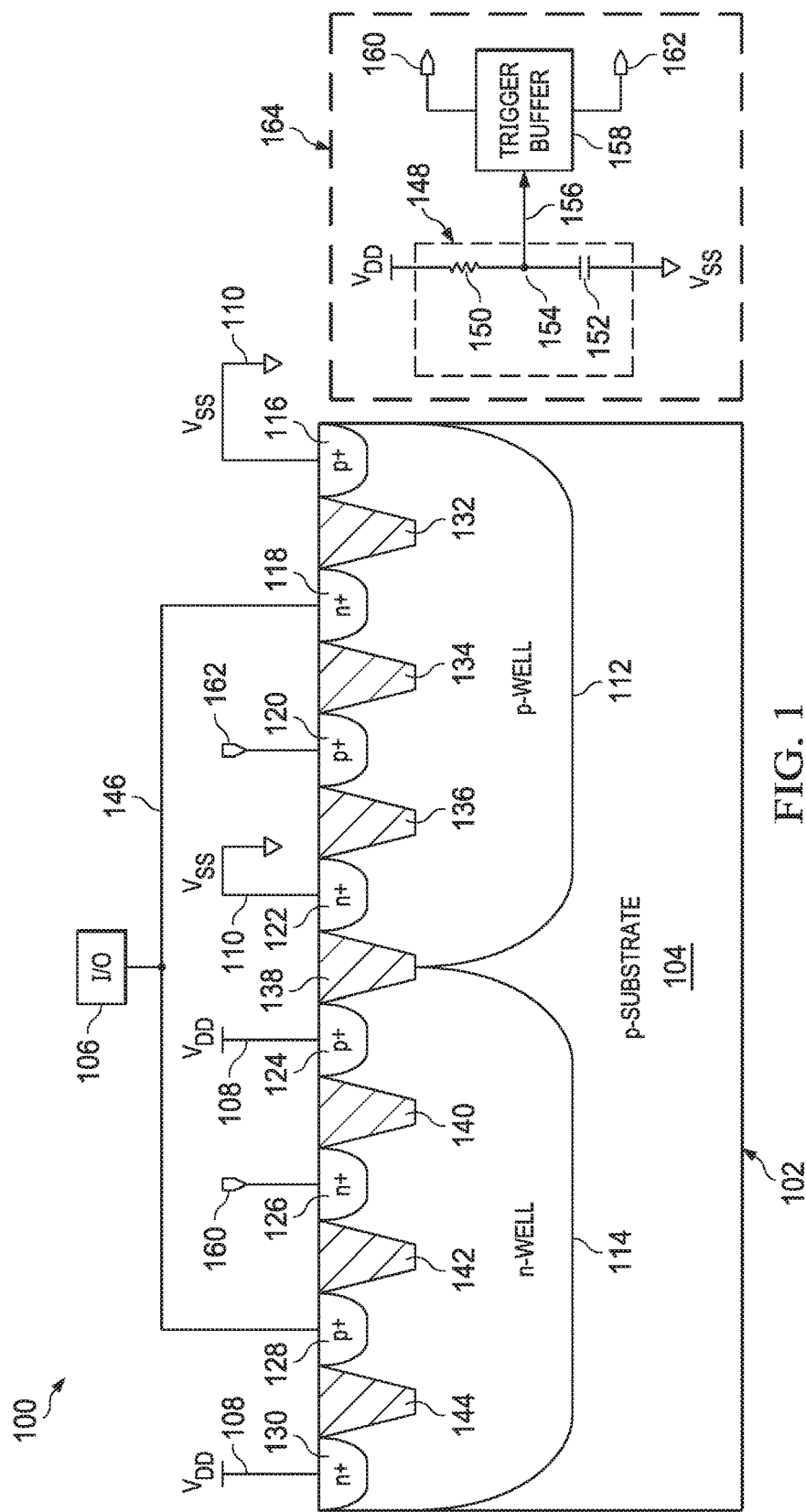
FIG. 1 shows an ESD device in accordance with various examples.

FIG. 1 shows an illustrative ESD device 100. FIG. 1 illustrates part of the illustrative ESD device 100 as a simplified cross-section, not drawn to scale, whereas other parts of the illustrative ESD device 100 are illustrated with circuit symbols.

A semiconductor 102 has a p-type substrate 104, although some embodiments could have an n-type substrate. FIG. 1 shows an I/O pad 106, a supply rail 108 at a voltage Vdd, and a ground rail 110 at a ground or substrate voltage Vss. The ground rail 110 may be referred to as ground. A p-well 112 and an n-well 114 are formed in the p-substrate 104 of the semiconductor 102.

Several p-type regions and n-type regions are formed in the p-well 112 and in the n-well 114. These regions are formed over several process steps in which photoresist layers (not shown) are patterned and etched to expose selected areas of the p-well 112 and the n-well 114, where dopants are implanted into the selected areas to form the several p-type regions and n-type regions. Formed in the p-well 112 are: a p-type region 116, an n-type region 118, a p-type region 120, and an n-type region 122. Formed in the n-well 114 are: a p-type region 124, an n-type region 126, a p-type region 128, and an n-type region 130. The p-type regions 116 and 120 are highly doped to form body contacts with the p-well 112 and ohmic contacts with metallization (not shown) for interconnects. The n-type regions 118 and 122 are also highly doped regions to form PN junctions with the p-well 112 and ohmic contacts with metallization for interconnects. The n-type regions 126 and 130 are highly doped to form body contacts with the n-well 114 and ohmic contacts with metallization for interconnects. The p-type regions 124 and 128 are also highly doped regions to form PN junctions with the n-well 114 and ohmic contacts with metallization for interconnects. In some embodiments, as an example, a highly doped region may have a dopant concentration profile ranging from $10^{16}$ cm$^3$ to $10^{20}$ cm$^{-1}$, although dopant concentration profiles for some embodiments may range over different values than this example.

Several Shallow Trench Isolation (STI) regions are formed before forming the p-type regions and the n-type regions so that the STI regions lie in between pairs of p-type regions and n-type regions to provide electrical isolation. An STI region 132 is between the p-type region 116 and the n-type region 118 to isolate these two regions, an STI region 134 is between the n-type region 118 and the p-type region 120 to isolate these two regions, an STI region 136 is in between the p-type region 120 and the n-type region 122 to isolate these two regions, an STI region 138 is in between the n-type region 122 and the p-type region 124 to isolate these two regions, an STI region 140 is in between the p-type region 124 and the n-type region 126 to isolate these two regions, an STI region 142 is in between the n-type region 126 and the p-type region 128 to isolate these two regions, and an STI region 144 is in between the p-type region 128 and the n-type region 130 to isolate these two regions.

The n-type region 118 and the p-type region 128 are electrically coupled to the I/O pad 106. FIG. 1 illustrates this electrical coupling with a simplified circuit connection comprising an interconnect 146. To provide the electrical coupling of the n-type region 118 and the p-type region 128 to the I/O pad 106, electrical contacts are formed in the n-type region 118 and the p-type region 128, and various interconnects are formed in one or more layers above the active area of the semiconductor 102 in a Back End Of Line (BEOL) process, but for ease of illustration circuit symbols are used to indicate the electrical coupling. The p-type region 116 and the n-type region 122 are electrically coupled to the ground rail 110. The p-type region 124 and the n-type region 130 are electrically coupled to the supply rail 108. Simple circuit symbols are used to illustrate these electrical couplings.

A resistor-capacitor (RC) circuit 148, comprising a resistor 150 and a capacitor 152, is coupled to the supply rail 108 and to the ground rail 110. In the particular embodiment illustrated in FIG. 1, the resistor 150 has a terminal directly connected to the supply rail 108, and the capacitor 152 has a terminal directly connected to the ground rail 110. The relative positions of the resistor 150 and the capacitor 152 may be interchanged, where in some embodiments the resistor 150 has a terminal directly connected to the ground rail 110, and the capacitor 152 has a terminal directly connected to the supply rail 108.

The voltage at a node 154 of the RC circuit 148 is provided to an input port 156 of a trigger buffer 158. The combination of the RC circuit 148 and the trigger buffer 158 may be referred to as a triggering circuit 164. The triggering circuit 164 (or trigger buffer 158) has an output port 160 and an output port 162. The output port 160 is electrically coupled to the n-type region 126, where an input port 160 to the n-type region 126 having the same label as the output port 160 indicates this electrical connection. The output port 162 is electrically coupled to the p-type region 120, where an input port 162 to the p-type region 120 having the same label as the output port 162 indicates this electrical connection.

In some embodiments, the triggering circuit 164 may have the output 160, but not the output port 162, so that the p-type region 120 is not directly coupled directly to an output port of the triggering circuit 164. In some embodiments, the triggering circuit 164 may have the output 162, but not the output port 160, so that the n-type region 126 is not directly coupled directly to an output port of the triggering circuit 164. Operation of the triggering circuit 164 is discussed in more detail later.

FIG. 1 provides a simplified cross-sectional view of that part of the illustrative ESD device 100 comprising the semiconductor 102. Circuit components are used to illustrate that part of the illustrative ESD device 100 comprising the I/O pad 106, the supply rail 108, the ground rail 110, the input ports 160 and 162, and the triggering circuit 164. In some embodiments, the circuit components illustrated in FIG. 1 are fabricated in the semiconductor 102, or in layers integrated with the semiconductor 102.

Figure 2:
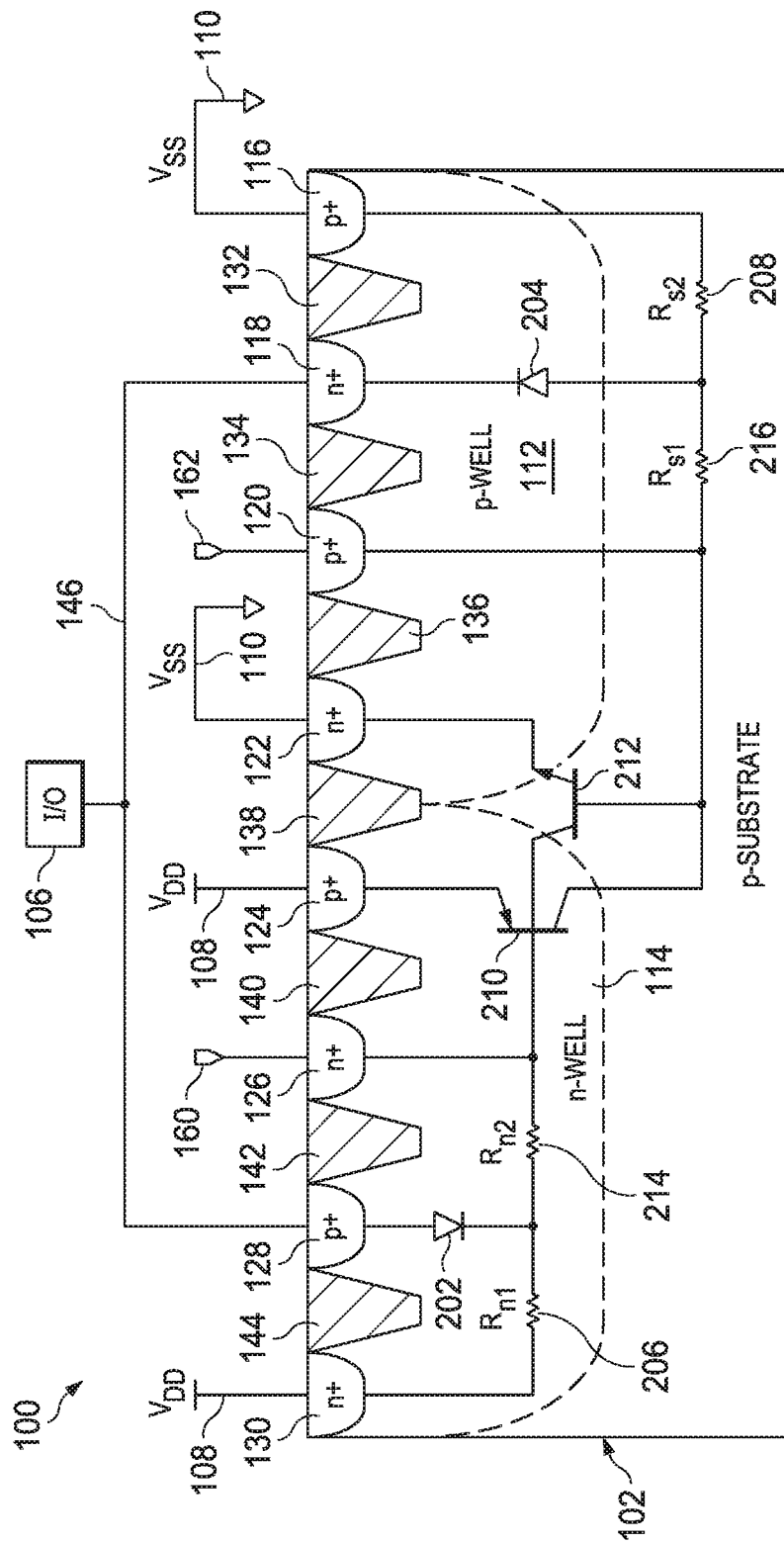
FIG. 2 shows a circuit representation of an ESD device in accordance with various examples.

FIG. 2 shows illustrative parasitic circuit components that may be identified in the illustrative ESD device 100 of FIG. 1. Referring to FIG. 2, a PN junction comprising the p-type region 128 and the n-well 114 forms a diode 202. The p-type region 128 serves as the anode of the diode 202, and the n-well 114 serves as the cathode of the diode 202. A PN junction comprising the n-type region 118 and the p-well 112 forms a diode 204. The n-type region 118 serves as the cathode of the diode 204, and the p-well 112 serves as the anode of the diode 204. A resistor 206 denotes a distributed resistance Rn1 from the cathode of the diode 202 to the n-type region 130. A resistor 208 denotes a distributed resistance Rs2 from the anode of the diode 204 to the p-type region 116.

The combination of the PN junction comprising the p-type region 124 and the n-well 114, and the PN junction comprising the p-type substrate 104 and the n-well 114, forms a PNP transistor 210. The p-type region 124 serves as the emitter of the transistor 210, the n-well 114 serves as the base of the transistor 210, and the p-type substrate 104 serves as the collector of the transistor 210. The combination of the PN junction comprising the p-well 112 and the n-well 114, and the PN junction comprising the p-well 112 and the n-type region 122, forms an NPN transistor 212. The n-type region 122 serves as the emitter of the transistor 212, the p-well 112 serves as the base of the transistor 212, and the n-well 114 serves as the collector of the transistor 212.

The base of the transistor 210 is electrically coupled to the collector of the transistor 212 and to the n-type region 126. The collector of the transistor 210 is electrically coupled to the base of the transistor 212, and to the p-type region 120. A resistor 214 denotes a distributed resistance Rn2 from the base of the transistor 210 to the cathode of the diode 202. A resistor 216 denotes a distributed resistance Rs1 from the base of the transistor 212 to the anode of the diode 204.

Figure 3:
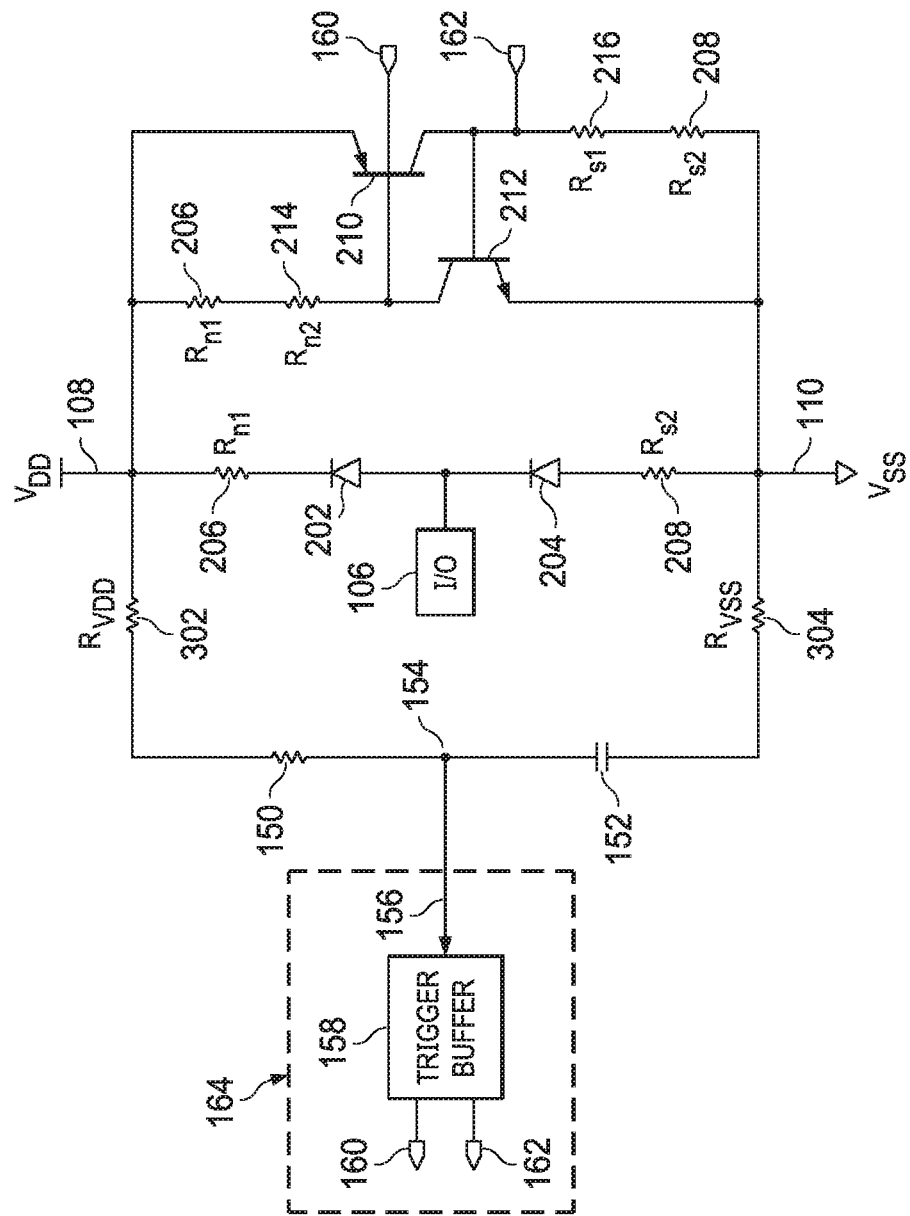
FIG. 3 shows a circuit representation of an ESD device in accordance with various examples.

FIG. 3 shows an illustrative circuit representing the parasitic circuit components illustrated in FIG. 2 and the circuit components illustrated in FIG. 1. A resistor 302 represents a distributed resistance RVdd in the supply rail 108, and a resistor 304 represents a distributed resistance RVss in the ground rail 110. Other circuit components illustrated in FIG. 3 have been previously discussed with respect to FIG. 1 and FIG. 2.

Referring to FIG. 3, the configuration of the transistor 210 and the transistor 212 can be identified as a Silicon Controlled Rectifier (SCR). Sourcing a sufficient amount of current into the base of the transistor 212, that is, into the input port 162, latches ON the SCR. Sinking a sufficient amount of current from the base of the transistor 210, that is, from the input port 160, latches ON the SCR. When latched ON, the SCR provides a low impedance path from the supply rail 108 to the ground rail 110.

For some embodiments, the triggering circuit 164 may utilize both the output port 160 and the output port 162, whereas in some embodiments the triggering circuit 164 may employ only one of these output ports. First consider the case in which the triggering circuit 164 utilizes the output port 162 but not the output port 160. In this case, the triggering circuit 164 does not directly affect the base of the transistor 210.

A positive-going voltage spike (or bounce) on the I/O pad 106 with respect to the ground (or substrate voltage) Vss of the ground rail 110, if sufficiently greater than the voltage Vdd on the supply rail 108, will forward bias the diode 202. With the diode 202 forward conducting, the voltage developed at the node 154 starts to decrease. If this voltage falls below a first threshold, the trigger buffer 158 sources sufficient current at the output port 162 to switch ON the transistor 212, thereby latching ON the SCR. A low impedance path is provided between the supply rail 108 and the ground rail 110 to discharge the positive-going voltage spike on the I/O pad 106.

Selecting values for the resistance and capacitance of the RC circuit 148, and selecting a value for the first threshold, determine the circumstances under which the SCR comprising the transistors 210 and 212 is triggered ON. These parameters may be selected to reduce unwanted false triggering, but adjusted to sufficiently protect circuits on the semiconductor 102 from harmful voltage spikes on the I/O pad 106.

Consider the case in which the triggering circuit 164 utilizes the output port 160 but not the output port 162. In this case, the triggering circuit 164 does not directly affect the base of the transistor 212. A positive-going voltage spike (or bounce) on the I/O pad 106 if sufficiently greater than the voltage on the supply rail 108, Vdd, will forward bias the diode 202. With the diode 202 forward conducting, the voltage developed at the node 154 starts to decrease. If this voltage falls below a second threshold, then the trigger buffer 158 sinks sufficient current at the output port 160 to switch ON the transistor 210, thereby latching ON the SCR. A low impedance path is provided between the supply rail 108 and the ground rail 110 to discharge the positive-going voltage spike on the I/O pad 106.

Selecting values for the resistance and capacitance of the RC circuit 148, and selecting a value for the second threshold, determine the circumstances under which the SCR comprising the transistors 210 and 212 is triggered ON.

For some embodiments, the trigger buffer 158 (or the triggering circuit 164) may utilize both the output port 160 and the output port 162, in which case behavior of the trigger buffer 158 may be a combination of the previously described behaviors for the cases in which the trigger buffer 158 utilizes only one of the output ports 160 and 162. For example, for a positive-going voltage spike on the I/O pad 106, the trigger buffer 158 may be configured so that if the voltage at the node 154 falls below a third threshold, the trigger buffer 158 sinks sufficient current at the output port 160 to switch ON the transistor 210 and sources sufficient current at the output port 162 to switch ON the transistor 212, thereby latching ON the SCR.

Regardless of whether the trigger buffer 158 makes use of the output port 160, the output port 162, or both, the diode 204 provides protection for negative-going voltage spikes (or bounces) by becoming forward conducting. A negative-going voltage spike (or bounce) on the I/O pad 106 with respect to the ground (or substrate voltage) Vss 110, if sufficiently below the ground or substrate voltage Vss of the ground rail 110, will forward bias the diode 204.

In some applications, such as fail-safe applications where a low-impedance path between the I/O pad 106 and the supply rail 108 is not available, the illustrative ESD device 100 is applicable to discharge positive-going voltage spikes on the I/O pad 106. For example, referring to FIG. 3, if the coupling to the supply rail 108 is not present, then for a positive-going voltage spike on the I/O pad 106 sufficiently large to forward bias the diode 202, the trigger buffer 158 may be configured so that as the voltage at the node 154 falls below a fourth threshold, the trigger buffer 158 latches ON the SCR so that a low impedance path is provided from the I/O pad 106 to the ground rail 110.

The first, second, third, and fourth thresholds may each have different numerical values, although for some embodiments some or all of these thresholds may have the same numerical value.

Figure 4:
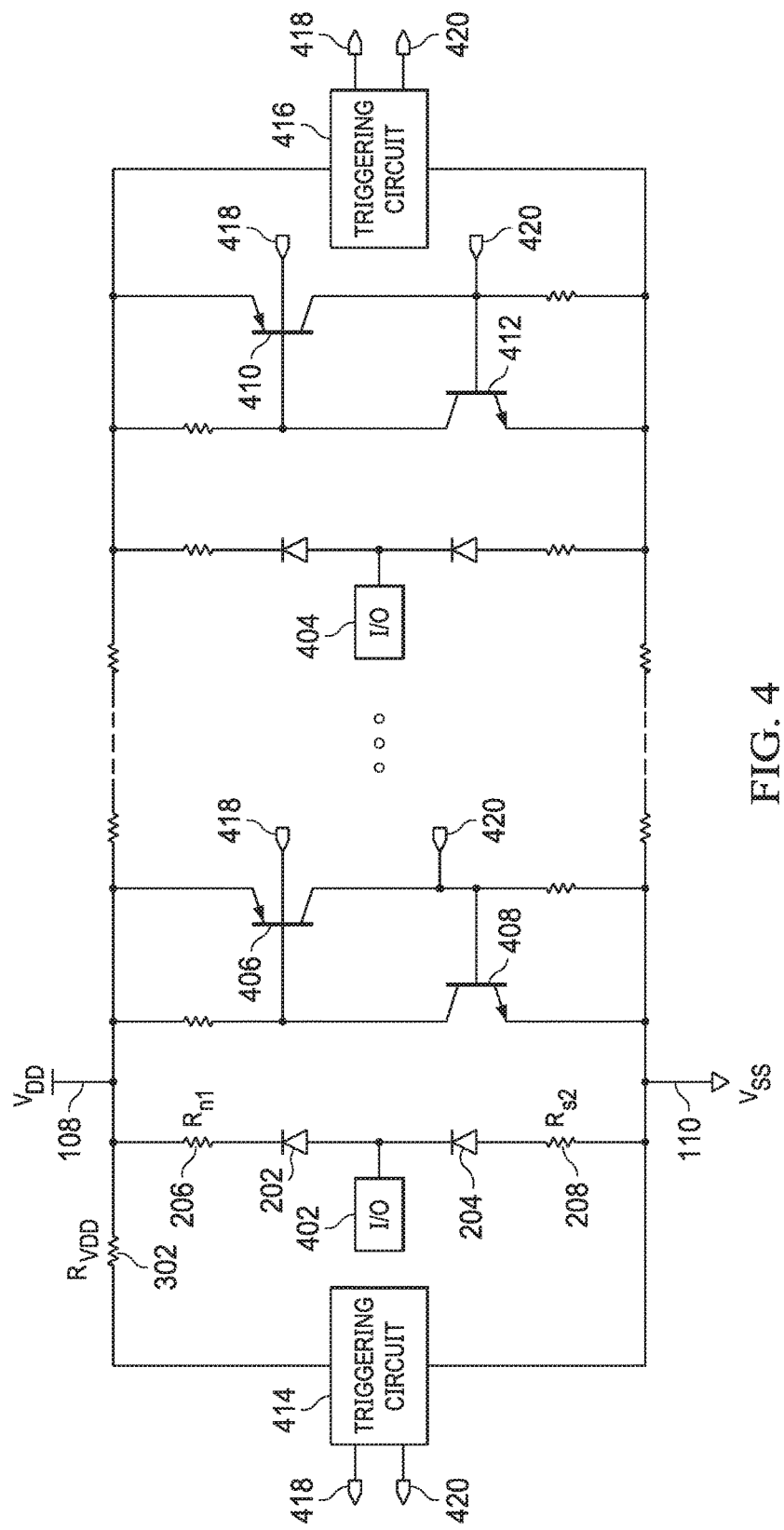
FIG. 4 shows a circuit representation of an ESD device for protecting multiple pads in accordance with various examples.

FIG. 4 shows an embodiment for protecting multiple I/O pads. An embodiment includes multiple instances of the illustrative ESD device 100 illustrated in FIG. 1, with an ESD device for each protected I/O pad. An embodiment includes multiple triggering circuits, with a triggering circuit for each protected I/O pad. The output ports of the triggering circuits are hardwired into a network for triggering multiple SCRs.

FIG. 4 explicitly shows two I/O pads, an I/O pad 402 and an I/O pad 404, and two SCRs and two triggering circuits. Transistors 406 and 408 are configured into an SCR, which may be associated with the I/O pad 402. Transistors 410 and 412 are configured into another SCR, which may be associated with the I/O pad 404. Because the SCRs are each coupled to the supply rail 108 and to the ground rail 110, the SCRs when triggered, whether separately or in combination, help discharge voltage spikes on any combination of the I/O pads.

An output port 418 of a triggering circuit 414 is hardwired to a corresponding output (also labeled 418) of a triggering circuit 416. The output port 418 is hardwired to the base of the transistor 406 and to the base of the transistor 410. An output port 420 of the triggering circuit 414 is hardwired to a corresponding output (also labeled 420) of the triggering circuit 416. The output port 420 is hardwired to the base of the transistor 408 and to the base of the transistor 412. The triggering circuits of FIG. 4 have the same structure and operation as described with respect to the triggering circuit 164 of FIG. 3, i.e., the combination of the trigger buffer 158 and the RC circuit comprising the resistor 150 and the capacitor 152.

Figure 5:
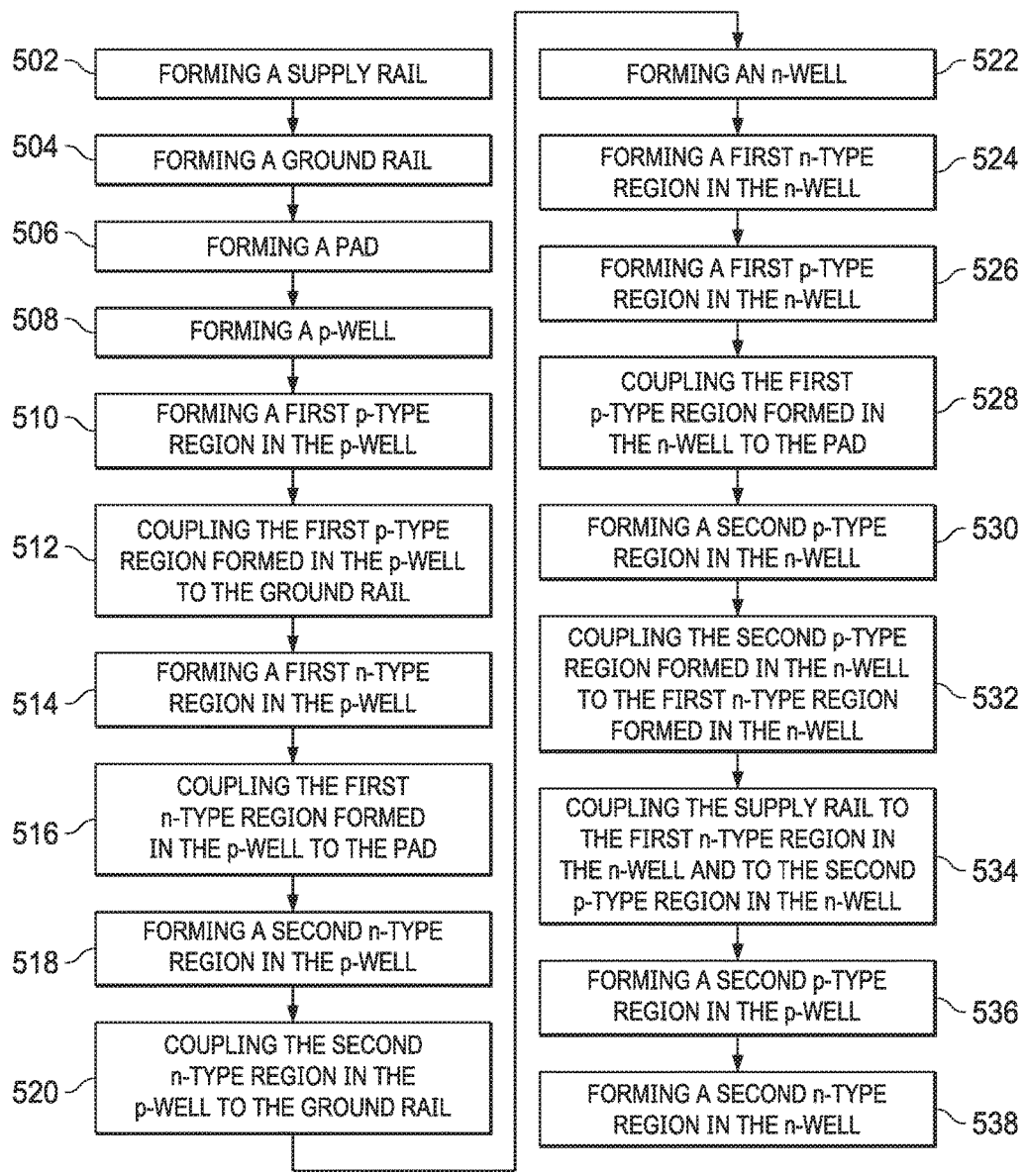
FIG. 5 shows a process for fabricating an ESD device in accordance with various examples.

FIG. 5 shows an illustrative process to fabricate the ESD device 100 in a semiconductor. The listing illustrated in FIG. 5 does not imply any particular ordering of the process steps, nor are all the steps required. Furthermore, many steps, such as growing or depositing oxide layers, photoresist layers, etchings, implanting dopants, etc., are omitted for brevity.

In step 502 a supply rail is formed, and in step 504 a ground rail is formed. In step 506, a pad is formed. In step 508, a p-well is formed. In step 510, a first p-type region in the p-well is formed. In step 512, the first p-type region formed in the p-well is coupled to the ground rail. In step 514, a first n-type region is formed in the p-well. In step 516, the first n-type region formed in the p-well is coupled to the pad. In step 518, a second n-type region is formed in the p-well. In step 520, the second n-type region in the p-well is coupled to the ground rail. In step 522, an n-well is formed. In step 524, a first n-type region is formed in the n-well. In step 526, a first p-type region is formed in the n-well. In step 528, the first p-type region formed in the n-well is coupled to the pad. In step 530, a second p-type region is formed in the n-well. In step 532, the second p-type region formed in the n-well is coupled to the first n-type region formed in the n-well. In step 534, the supply rail is coupled to the first n-type region in the n-well and to the second p-type region in the n-well. In step 536, a second p-type region is formed in the p-well. In step 538, a second n-type region is formed in the n-well.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electrostatic discharge device comprising:
    a semiconductor;
    a pad;
    a ground rail;
    a p-well formed in the semiconductor;
    a first p-type region formed in the p-well and electrically coupled to the ground rail;
    a first n-type region formed in the p-well and electrically coupled to the pad;
    a second n-type region formed in the p-well and electrically coupled to the ground rail;
    an n-well formed in the semiconductor;
    a first n-type region formed in the n-well;
    a first p-type region formed in the n-well and electrically coupled to the pad; and
    a second p-type region formed in the n-well and electrically coupled to the first n-type region formed in the n-well.

2. The electrostatic discharge device of claim 1, wherein the ground rail is at ground potential.

3. The electrostatic discharge device of claim 1, further comprising:
    an integrated circuit package; and
    an I/O package pin, wherein the pad is electrically coupled to the I/O package pin.

4. The electrostatic discharge device of claim 1, wherein the first p-type region formed in the p-well is highly doped to form an ohmic contact with the p-well, and the first n-type region formed in the n-well is highly doped to form an ohmic contact with the n-well.

5. The electrostatic discharge device of claim 4, further comprising:
a supply rail electrically coupled to the first n-type region formed in the n-well and to the second p-type region formed in the n-well.

6. The electrostatic discharge device of claim 5, further comprising:
an integrated circuit package; and
an I/O package pin, wherein the pad is electrically coupled to the I/O package pin.

7. The electrostatic discharge device of claim 6, wherein the ground rail is at ground potential.

8. The electrostatic discharge device of claim 1, further comprising:
a supply rail electrically coupled to the first n-type region formed in the n-well and to the second p-type region formed in the n-well.

9. The electrostatic discharge device of claim 1, further comprising:
a second p-type region formed in the p-well.

10. The electrostatic discharge device of claim 9, further comprising:
a triggering circuit electrically coupled to the first n-type region formed in the n-well and to the ground rail, and comprising an output port electrically coupled to the second p-type region formed in the p-well.

11. The electrostatic discharge device of claim 10, further comprising:
a supply rail electrically coupled to the first n-type region formed in the n-well;
wherein the triggering circuit comprises an RC circuit comprising a resistor and a capacitor in series with the resistor, wherein the RC circuit is electrically coupled to the first n-type region formed in the n-well and to the ground rail.

12. The electrostatic discharge device of claim 11, wherein the triggering circuit further comprises:
a trigger buffer coupled to the RC circuit, the trigger buffer to source current at the output port of the triggering circuit in response to a voltage spike on the pad.

13. The electrostatic discharge device of claim 9, further comprising:
a second n-type region formed in the n-well; and
a supply rail electrically coupled to the first n-type region formed in the n-well and to the second p-type region formed in the n-well.

14. The electrostatic discharge device of claim 13, further comprising:
a triggering circuit electrically coupled to the supply rail and to the ground rail, and comprising a first output port electrically coupled to the second p-type region in the p-well, and a second output port electrically coupled to the second n-type region in the n-well.

15. The electrostatic discharge device of claim 14, wherein the triggering circuit comprises:
an RC circuit comprising a resistor and a capacitor in series with the resistor, wherein the RC circuit is electrically coupled to the supply rail and to the ground rail.

16. The electrostatic discharge device of claim 15, wherein the triggering circuit further comprises:
a trigger buffer coupled to the RC circuit, the trigger buffer to source current at the first output port of the triggering circuit in response to a voltage spike on the pad, and to sink current at the second output port of the triggering circuit in response to a voltage spike on the pad.

17. The electrostatic discharge device of claim 13, further comprising:
a first isolation region between the first p-type region formed in the p-well and the first n-type region formed in the p-well;
a second isolation region between the first n-type region formed in the p-well and the second p-type region formed in the p-well;
a third isolation region between the second p-type region formed in the p-well and the second n-type region formed in the p-well;
a fourth isolation region between the second n-type region formed in the p-well and the second p-type region formed in the n-well;
a fifth isolation region between the second p-type region formed in the n-well and the second n-type region formed in the n-well;
a sixth isolation region between second n-type region formed in the n-well and the first p-type region formed in the n-well; and
a seventh isolation region between the first p-type region formed in the n-well and the first n-type region formed in the n-well.

18. A process comprising:
forming a ground rail on a semiconductor;
forming a pad on the semiconductor;
forming a p-well in the semiconductor;
forming a first p-type region in the p-well;
coupling the first p-type region formed in the p-well to the ground rail;
forming a first n-type region in the p-well;
coupling the first n-type region formed in the p-well to the pad;
forming a second n-type region in the p-well;
coupling the second n-type region formed in the p-well to the ground rail;
forming an n-well in the semiconductor;
forming a first n-type region in the n-well;
forming a first p-type region in the n-well;
coupling the first p-type region formed in the n-well to the pad;
forming a second p-type region in the n-well; and
coupling the second p-type region formed in the n-well to the first n-type region formed in the n-well.

19. The process of claim 18, further comprising:
forming a supply rail on the semiconductor;
coupling the supply rail to the first n-type region formed in the n-well and to the second p-type region formed in the n-well;
forming a second p-type region in the p-well; and
forming a second n-type region in the n-well.

* * * * *